United States Patent [19]
Warburton et al.

[11] Patent Number: 5,870,051
[45] Date of Patent: Feb. 9, 1999

[54] METHOD AND APPARATUS FOR ANALOG SIGNAL CONDITIONER FOR HIGH SPEED, DIGITAL X-RAY SPECTROMETER

[75] Inventors: William K. Warburton, 1300 Mills St., Menlo Park, Calif. 94025; Bradley Hubbard, Santa Cruz, Calif.

[73] Assignee: William K. Warburton, Mountain View, Calif.

[21] Appl. No.: 702,327

[22] Filed: Aug. 2, 1996

[51] Int. Cl.[6] .................................................. H03M 1/12
[52] U.S. Cl. .......................................... 341/155; 341/143
[58] Field of Search .................................. 341/143, 155, 341/110, 120, 118; 364/825; 378/91

[56] References Cited

U.S. PATENT DOCUMENTS

| | | | |
|---|---|---|---|
| 3,851,266 | 11/1974 | Conway | 328/164 |
| 3,872,287 | 3/1975 | Koeman | 235/151.31 |
| 3,894,219 | 7/1975 | Weigel | 235/150.5 |
| 4,421,986 | 12/1983 | Friauf et al. | 250/369 |
| 4,593,198 | 6/1986 | Pang et al. | 250/366 |
| 4,642,811 | 2/1987 | Georgopoulos | 378/53 |
| 4,658,216 | 4/1987 | Goulding et al. | 328/109 |
| 4,692,626 | 9/1987 | Westphal | 250/389 |
| 4,852,135 | 7/1989 | Anisovich et al. | 378/49 |
| 5,005,146 | 4/1991 | Lakatos et al. . | |
| 5,210,423 | 5/1993 | Arseneau | 250/369 |
| 5,349,193 | 9/1994 | Mott et al. . | |
| 5,392,042 | 2/1995 | Pellon | 341/143 |
| 5,524,133 | 6/1996 | Neale et al. | 378/53 |
| 5,602,507 | 2/1997 | Suzuki | 329/304 |
| 5,673,044 | 9/1997 | Pellon | 341/143 |

OTHER PUBLICATIONS

Farrow, R. et al., "X–ray signal processing electronics for solid state detectors," *Rev. Sci. Instrum.*, pp. 2307–2309, vol. 66, No. 2, Feb. 1995.

Jordanov, V.T. et al., "Digital pulse–shape analyzer based on fast sampling of an integrated charge pulse," *IEEE Transactions on Nuclear Science*, pp. 683–687, vol. 42, No. 4, Aug. 1995.

Jordanov, V.T. et al., "Digital techniques for real–time pulse shaping in radiation measurements," *Nuclear Instruments and Methods in Physics Research A* 353, pp. 261–264 Mar. 1994.

Mott, R.B. et al., "Improving EDS performance with digital pulse processing," *X–Ray Spectrometry in Electron Beam Instruments*, pp. 1–28 (D.B. Williams et al., New York, Plenum) Jan. 1994.

Takahashi, H. et al., "A new pulse height analysis system based on fast ADC digitizing technique," *IEEE Transactions on Nuclear Science*, pp. 626–629, vol. 40, No. 4, Aug. 1993.

Georgiev, A. et al., "An analog–to–digital conversion based on a moving window deconvolution," *IEEE Transactions on Nuclear Science*, pp. 1116–1124, vol. 41, No. 4, Aug. 1994.

Al–Haddad, M.N. et al., "Development and testing of a flash analog–to–digital converter based system for pulse shape discrimination of nuclear radiation pulses," *IEEE Transactions on Nuclear Science*, pp. 1765–1769, vol. 41, No. 5, Oct. 1994.

*Primary Examiner*—Brian K. Young
*Assistant Examiner*—Peguy JeanPierre
*Attorney, Agent, or Firm*—Townsend and Townsend and Crew LLP

[57] ABSTRACT

A signal processing system which accepts input from an x-ray detector-preamplifier and produces a signal of reduced dynamic range for subsequent analog-to-digital conversion. The system conditions the input signal to reduce the number of bits required in the analog-to-digital converter by removing that part of the input signal which varies only slowly in time and retaining the amplitude of the pulses which carry information about the x-rays absorbed by the detector. The parameters controlling the signal conditioner's operation can be readily supplied in digital form, allowing it to be integrated into a feedback loop as part of a larger digital x-ray spectroscopy system.

39 Claims, 5 Drawing Sheets

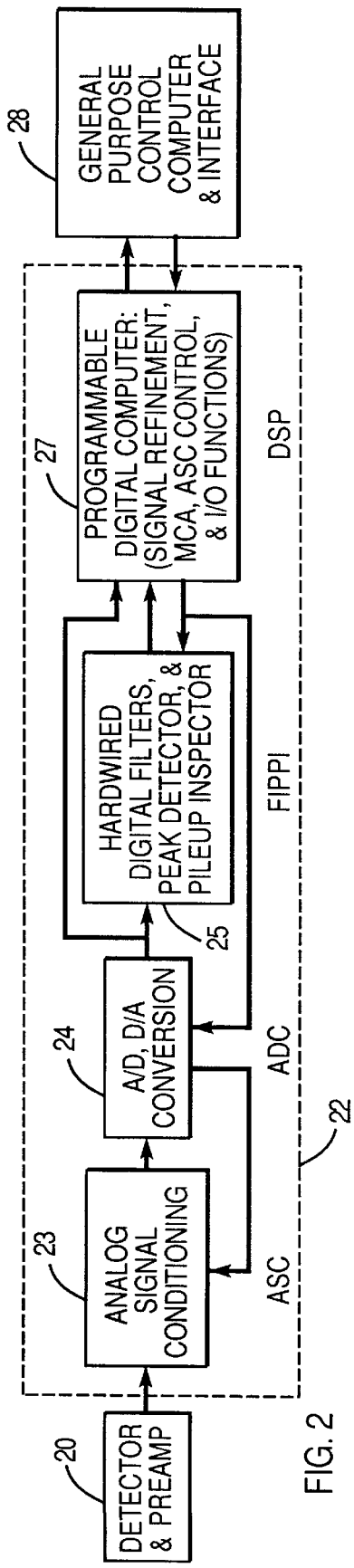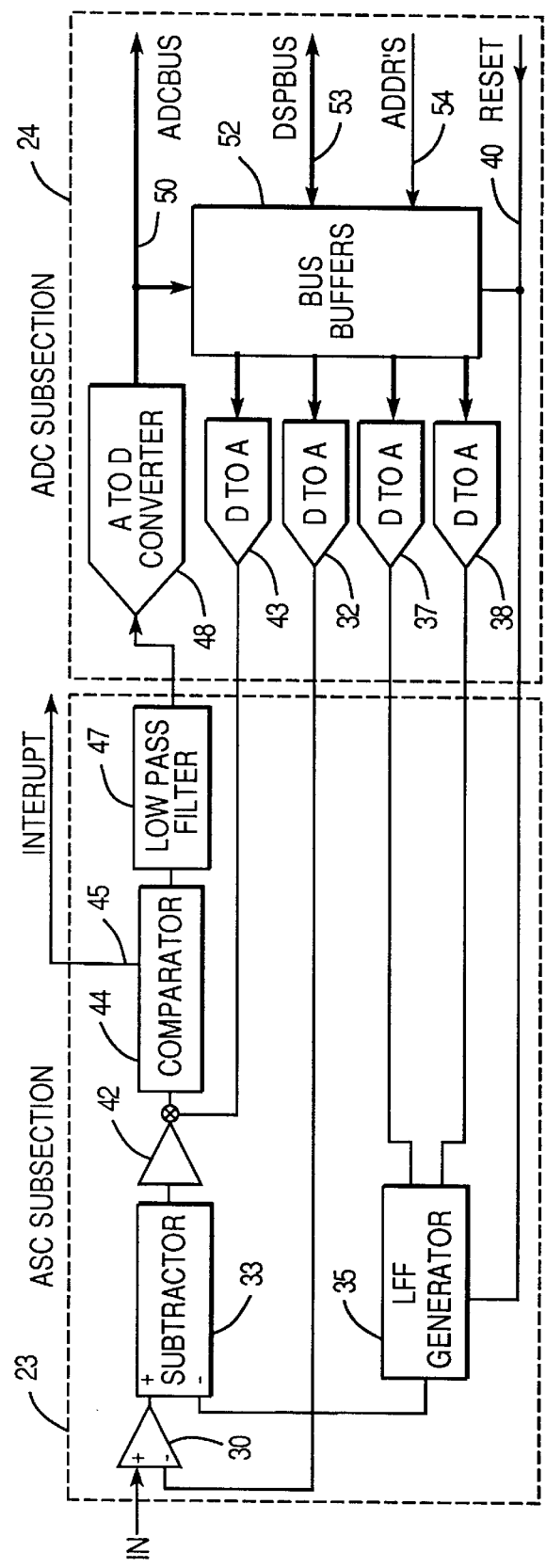
FIG. 2
FIG. 3

METHOD AND APPARATUS FOR ANALOG SIGNAL CONDITIONER FOR HIGH SPEED, DIGITAL X-RAY SPECTROMETER

GOVERNMENT RIGHTS

The U.S. Government has rights in this invention pursuant to Contract No. DE-FG03-92ER81311 awarded by the Department of Energy.

CROSS-REFERENCE TO RELATED APPLICATIONS

This application claims priority from, and is a continuation-in-part of, provisional application No. 60/002,266, filed Aug. 14, 1995, which provisional application is hereby incorporated by reference.

The following four commonly-owned copending applications, including this one, are being filed concurrently and the other three are hereby incorporated by reference into this one:

Application Ser. No. 08/702,327, filed Aug. 2, 1996, of William K. Warburton and Bradley Hubbard, entitled "METHOD AND APPARATUS FOR ANALOG SIGNAL CONDITIONER FOR HIGH SPEED, DIGITAL X-RAY SPECTROMETER" (Attorney Docket 17032-1-1);

Application Ser. No. 08/695,063, filed Aug. 2, 1996, now U.S. Pat. No. 5,684,850, issued Nov. 4, 1997 to William K. Warburton and Bradley Hubbard entitled "METHOD AND APPARATUS FOR DIGITALLY BASED HIGH SPEED X-RAY SPECTROMETER" (Attorney Docket 17032-1-2);

Application Ser. No. 08/695,062, filed Aug. 2, 1996, of William K. Warburton, entitled "METHOD AND APPARATUS FOR DIGITALLY BASED HIGH SPEED X-RAY SPECTROMETER FOR DIRECT COUPLED USE WITH CONTINUOUS DISCHARGE PREAMPLIFIERS" (Attorney Docket 17032-1-3); and Application Ser. No. 08/730,916, filed Aug. 2, 1996, of William K. Warburton and Carl Zhou entitled "METHOD AND APPARATUS FOR COMBINATORIAL LOGIC SIGNAL PROCESSOR IN DIGITALLY BASED HIGH SPEED X-RAY SPECTROMETER" (Attorney Docket 17032-1-4).

BACKGROUND OF THE INVENTION

The present invention relates generally to systems for digitally processing the pulses generated in detector systems in response to absorbed radiation and, more particularly, to analog conditioning the signals in such systems prior to their digitization and subsequent digital processing in high resolution, high rate, digital spectrometers for x-rays or gamma rays.

There is a need, in very high counting rate applications such as synchrotron radiation research, for improved x-ray spectrometers. In many of these applications it is desired to detect and count x-rays of one particular energy under conditions where such x-rays of interest are greatly outnumbered by x-rays of a different but nearby energy. A typical example would include X-ray Absorption Spectroscopy (XAS) of dilute metallo-protein solutions, where elastically scattered incident x-rays (noise events) greatly outnumber the fluorescence x-rays (signal events) from the metal of interest. Since the x-ray spectrometer's total count rate capability is limited by energy resolution considerations, it spends most of its time processing noise pulses, which limits the acquisition rate of good signal pulses. Under these conditions it is advantageous to employ multiple detector systems to increase the total acquisition rate of good signals.

Commercial spectrometers with 13 channels are now fairly commonly sold and many researchers are considering systems with over 100 channels. This technique is limited by several factors, including cost, lack of high count rate capability with pileup inspection, the lack of an energy resolved analysis of the spectrum seen by each detector, the practical difficulties associated with retuning the processing electronics for a large number of detector channels, and, often, the sheer bulk of the required electronics.

Cost is an important issue because of the large number of detector channels to be implemented. Typical instrumentation for a single detector channel using a high quality analog spectroscopy amplifier and energy spectrum analyzer ("multi-channel analyzer" or MCA) presently costs approximately $6,000. The cost of outfitting the desired 100 channels is thus prohibitively expensive for most researchers. Because of price and counting rate considerations, usually only an energy window analysis ("single channel analyzer" or SCA) is used, even for systems with only a few detectors.

A significant fraction of interesting synchrotron experiments also require energy analysis, however. These are typically experiments done using softer x-rays, in the region of 2000–4000 eV, where the energy resolution of even the best spectrometers is not adequate to fully resolve the signal energy of interest from the background energies. In these cases a simple SCA window cannot be set to accept only signal counts. Instead a full energy analysis is required, using peak fitting or deconvolution techniques to extract the signal peak from any nearby background peaks.

The throughput, or maximum countrate capability, of energy analyzing spectrometers is often set by the time it takes for the energy analyzer to process a pulse. During this time the system is "dead" and cannot accept other pulses. Common MCAs, particularly the low cost variety which are configured as personal computer cards, can be quite slow, usually limiting count rates to less than 50,000 per second. Because a factor of 10 increase is desired for synchrotron applications, MCAs are not usually employed and the cheaper and faster windowing SCAs are used instead.

Digital spectrometers have been viewed as a solution to both these problems since, once an x-ray signal pulse has been converted to a shaped peak by a digital filter and the peak's maximum value captured, the problem of providing the MCA function becomes easy since the captured magnitude is already a digital value and can be used directly as an address in the histogramming process required to produce a spectrum. No deadtime is introduced either, again because the value is already digital.

To inspect for pileup, the spectrometer must be able to detect the arrival times of the pulses coming from the preamplifier and then reject those that are closer together than the spectrometer's shaping time. If this is not done, such pulses are summed by the processing circuitry ("piling up"), and produce spectral distortions in the output. Because pileup occurs as the square of the input pulse rate, pileup inspection becomes a necessity when operating at the high count rates encountered in synchrotron experiments. The ability of the inspection circuitry to resolve sequential pulses in a digital system is generally limited by the sampling rate of its analog-to-digital converter (ADC), which defines the inter-sample period. As the number of sample periods between two sequential pulses decreases it becomes increasingly difficult to determine that, in fact, more than a single pulse is present. For very high data rates, then, high ADC sampling rates are required to minimize the number of undetected piled-up events.

Spectrometer bulk also becomes an issue when many detector channels are required. The conventional electronics required for a 13 element detector array alone completely fill an electronics rack. Thus considerably higher density is required if 100 element arrays are to be practically implemented, since even that single equipment rack has already begun to become unwieldy.

For these synchrotron applications, and many others as well, it would thus be advantageous to have a low cost, small volume spectrometry device capable of providing full energy analysis with good energy resolution at high count rates and be further capable of being interfaced to a computer system so that necessary tuning operations could be accomplished automatically by an appropriate program.

Spectrometers based on digital signal processing techniques have been considered as a solution to these problems as well, since digital circuitry is often both denser and cheaper than analog circuitry, because interfacing the spectrometer to a computer system would be quite natural, and, as noted above, providing MCA functionality could be accomplished, deadtime free, with little additional cost. In practice, however, practical attempts to produce low cost, digital spectrometer systems have failed. Experience shows that the preamplifier signal must be digitized with approximately 14 bits of accuracy in order to achieve acceptable energy resolution, and available ADCs which are both fast enough to give good time resolution and have this many bits are still very expensive. The only digitally based spectrometers produced to date have been approximately twice as expensive as conventional analog spectrometers.

SUMMARY OF THE INVENTION

The present invention provides analog signal conditioning prior to digitization in the signal chain in a physically compact, low cost, high speed method and apparatus for processing the pulse signals from a detector-preamplifier system and providing a complete energy analysis of the radiation impinging on the detector (i.e., a "digital spectrometer"). The primary function of the invention Analog Signal Conditioner (ASC) is to reduce the dynamic range of the preamplifier signals input to the digital spectrometer so that fewer bits are required in its analog-to-digital converter (ADC) and digital signal processing (DSP) portions, thus allowing the use of lower cost and/or higher speed parts than could otherwise be employed. In a specific embodiment, the invention ASC has enabled the creation of a digital spectrometer capable of duplicating the energy resolution of state of the art analog x-ray spectrometers while exceeding their pileup rejection and count rate performance. The resultant spectrometer built incorporating the present invention had its overall cost reduced by a factor of about 4 and its physical volume by a factor of over 10, compared to commercial analog circuitry of comparable capability.

More specifically, the invention ASC conditions the input preamplifier's pulse stream by removing its slowly time varying components in a controlled manner. The remaining signal, which carries the information of interest about the energies of the detected x-rays, has a considerably reduced dynamic range, compared to the analog input signal, producing the benefits noted above. Parameters describing the slowly varying components are supplied externally to the ASC, typically from an analog or digital feedback loop. In a preferred embodiment, these ASC input control parameters are set digitally, allowing a control loop to be set up using the DSP in the downstream digital spectrometer.

In this embodiment, the ASC comprises: an input buffer amplifier; a waveform generator which is digitally controlled by the DSP; a summing amplifier to subtract the generated waveform from the buffered input signal; an amplifier stage whose gain is digitally controlled by the DSP; an excursion detection circuit which signals the DSP if the amplified difference signal departs from the ADC's allowed input range; and a filter whose bandwidth is less than the Nyquist frequency of the subsequent ADC.

For presently common preamplifier signals, it is sufficient for the generated waveform to consist of two components: a DC offset whose value is generated using a digital-to-analog converter (DAC) whose digital inputs come from the DSP; and a resetting ramp (sawtooth) function consisting of alternating ramps and resets. The ramp slope is controlled by another DAC and resetting is initiated on command from the DSP. This approach can be readily adapted to other preamplifier signals simply by appropriately adjusting the shape of the generated waveform.

Occasionally, either fluctuations in input counting rate or very large amplitude events will cause the ASC's amplified difference signal to depart from the ADC's allowed input range, resulting in the generation of invalid digital data. The ASC's excursion detection circuit signals this condition to the DSP, which then stops processing data and executes a routine to adjust the ASC's control parameters (slope and offset DAC values) to return the ASC output to the proper ADC input range. The DSP can then resume data collection and processing.

The DSP generally controls the ASC by setting input values to the ASC's offset and slope DACs and then resetting the slope generator as required. The initial DAC settings are estimated when operation starts, and the estimate of the slope DAC setting is updated from time to time to compensate for variations in the rate of arrival of x-rays to the detector. If the ASC output goes out of the ADC's input range, as noted above, then only the offset DAC need be adjusted to restore it. These adjustments constitute a feedback control loop to optimize the ASC's operation. Further, the DSP's knowledge of the instantaneous values of the control parameters allows it to make any such adjustments as may be required to correct the output spectrum for distortions introduced by the ASC's conditioning action.

A further understanding of the nature and advantages of the present invention may be realized by reference to the remaining portions of the specification and the drawings.

BRIEF DESCRIPTION OF THE DRAWINGS

FIG. 2 is a block diagram of circuitry embodying the invention, showing its major parts and its connections to other equipment;

FIG. 3 is a block diagram of the Analog Signal Conditioning (ASC) and A to D hardware blocks of FIG. 2;

DESCRIPTION OF SPECIFIC EMBODIMENTS

1. Preamplifier Issues

1.1. Preamplifier Input Signals

Figure 1C:
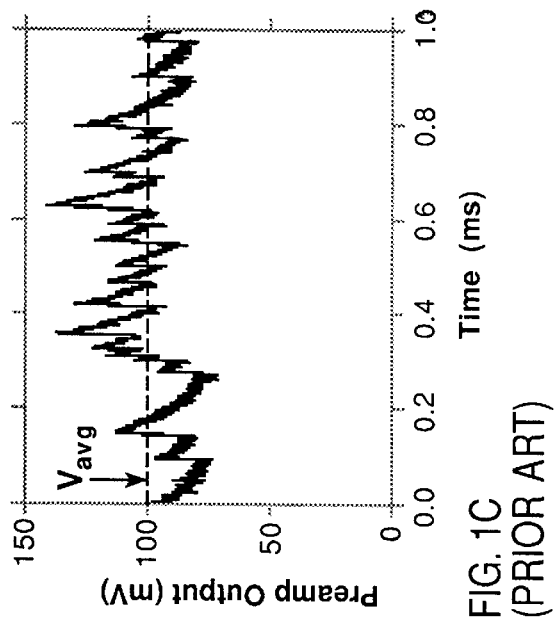
FIG. 1C demonstrates typical outputs from a continuous discharge detector-preamplifier over the course of multiple x-rays.
Figure 1B:
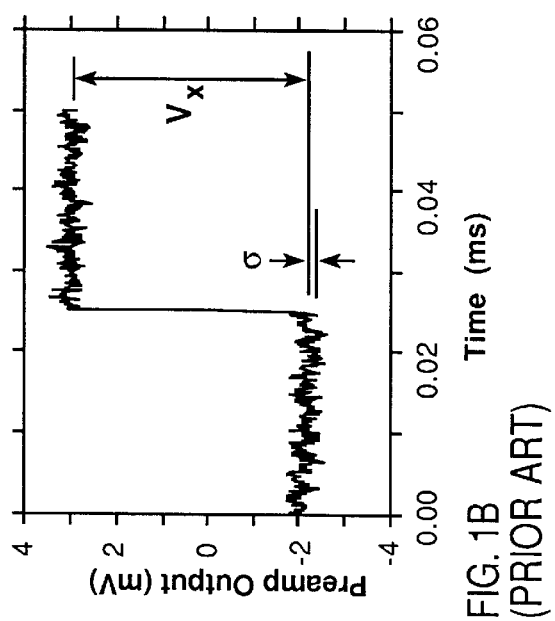
FIG. 1B is the trace of a typical output signal from the detector-preamplifier resulting from the absorption of a single x-ray in the detector.

The description of specific embodiments will be clarified by a brief discussion of the electrical pulses, each corresponding to a detected x-ray, which we intend to process. Such pulses, in the common case of a semiconductor x-ray detector, are generated by a circuit similar to that shown in FIG. 1A. This circuit comprises a semiconductor detector diode 10 reverse biased by a voltage supply 12 and connected to charge integrating preamplifier 13 with a feedback capacitor $C_f$ 15 and a feedback element 17. When diode 10 absorbs an x-ray of energy $E_x$, a charge $Q_x$ equal to $E_x/\epsilon$ is released, where the constant $\epsilon$ is characteristic of the diode semiconductor material. $Q_x$ is integrated on $C_f$ 15 and produces an output voltage step $V_x$ equal to $Q_x/C_f$—such as is shown in FIG. 1B. Obtaining an accurate estimate of $E_x$ therefore requires accurately measuring the voltage step $V_x$ in the presence of the preamplifier's output noise voltage, whose rms value is indicated in FIG. 1B by the value $\sigma$. In the present invention, digital filtering is used to reduce the amplitude of this noise and produce a more accurate estimate of $V_x$.

Functionally speaking, there are two basic types of energy sensitive preamplifiers. Because preamplifier 13 cannot integrate charge indefinitely without exceeding its linear operating range, the feedback element 17 is provided to discharge capacitor 15. In the first basic type, feedback element 17 continuously discharges capacitor 15 (the "CD" case), which is implemented in practice either by using a resistor for feedback element 17 (the classic case) or by other schemes such as forward biasing the JFET input transistor in preamplifier 13. A typical preamplifier output in the CD case is shown in FIG. 1C, and appears as a series of nearly vertical steps, each corresponding to a step such as shown in FIG. 1B, followed by an exponential decay as feedback element 17 bleeds charge off of capacitor 15. The average output voltage level, $V_{avg}$, results in a discharge current flow through feedback element 17 just equal to $I_{in}$, the input current flow from diode 10. This input current flow includes both leakage current and the current generated by the x-rays absorbed in diode 10. The maximum count rate the preamplifier can handle is set by the maximum value $V_{max}$ to which $V_{avg}$ can rise without fluctuations in the signal exceeding the preamplifier's linear operating range.

Figure 1A:
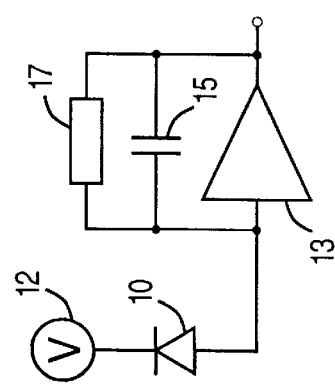
FIG. 1A is a circuit schematic of a representative detector-preamplifier system of the type which supplies pulses to the present invention.
Figure 1E:
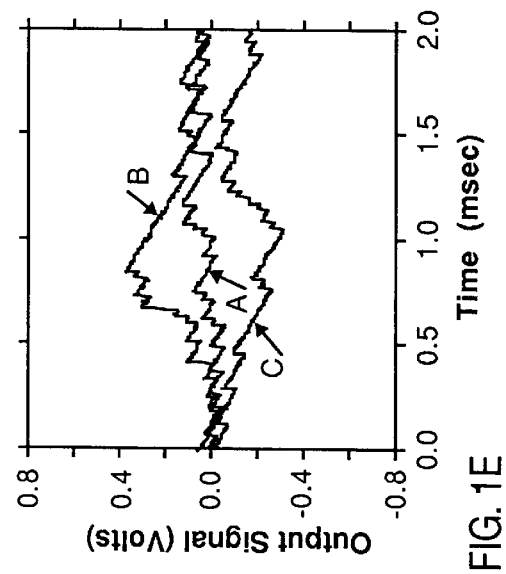
FIG. 1E shows three common x-ray pulse arrival patterns after the ASC has removed the reset-ramp portion of the signal.
Figure 1D:
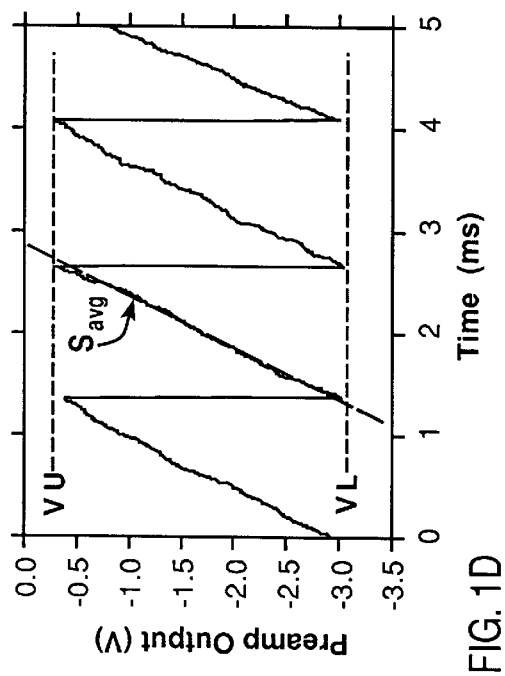
FIG. 1D demonstrates typical outputs from a periodic reset detector-preamplifier over the course of multiple x-rays.

In the second basic energy sensitive preamplifier type, feedback element 17 only discharges capacitor 15 at those moments when the output voltage of preamplifier 13 approaches the upper reset value VU which is slightly less than $V_{max}$. Feedback element 17 is essentially a switch, which remains closed until the voltage falls to a preset lower limit VL, when it opens again. This is the periodic reset ("PR") case and may be implemented either with a real transistor switch or by applying a pulse of light to the gate region of preamplifier 13's input JFET. This latter technique is known as pulsed optical feedback ("POF"). FIG. 1D shows a typical output for this case, which consists of a ramp of voltage steps from x-ray pulses which rise to VU, where reset occurs, causing the voltage to return to value VL, whence the process begins anew. Each voltage step has a shape similar to that shown in FIG. 1B and the resultant ramps have an average slope $S_{avg}$ equal to $I_{in}/C_f$. Typical fluctuations of the signal about the ramp are shown in FIG. 1E, where the individual x-ray arrivals are seen as small vertical steps.

1.2. Dynamic Range and Digitization Rate Issues

Selecting the ADC is possibly the single most important issue in implementing a digitally based x-ray spectrometer when both very good energy resolution and good pileup rejection at very high counting rates are required. First consider pileup rejection: If a digital system is to achieve the 200 ns pulse inspection times of modern analog x-ray spectrometers, it must sample at several times this rate to resolve pulses which are this closely spaced in time. As an estimate, 50 ns per sample or 20 megasamples/second (MSA) is required. Higher sampling rates could further improve the spectrometer's performance.

The requirement for good energy resolution, however, directly translates into ADC gain and dynamic range requirements, as may be seen by referring to FIG. 1B, where we wish to measure the step height $V_x$ in the presence of noise $\sigma$. In order to digitally filter the noise, experience shows that the voltage range $\sigma$ must be about 4 or more times the ADC's single bit resolution $\Delta V_1$. Thus the gain (volts/bit) of the amplifier stages preceding the ADC is effectively set by requirement $$4 \Delta V_1 \leq \sigma \tag{1}$$

Once $\Delta V_1$ has been set to resolve $\sigma$, then the ADC's dynamic range is set by the need to fully cover the range 0 to $V_{max}$. This number of required bits N may be calculated from:

$$N = \log(V_{max}/\Delta V_1)/\log(2) \tag{2}$$

where log is the base 10 logarithm. A typical value of N for high resolution x-ray spectrometry is 14.

Consider some typical examples: one common commercial detector-preamplifier combination, the Ortec GLP Series with Model 572 Preamplifier with high rate feedback resistor produces voltage steps of about 5 mV for 6 keV x-rays (Fe-55) and has rms noise of about 0.2 mV. One bit of ADC resolution should therefore correspond to about 50 $\mu$V. This preamplifier's full scale output is about 2 volts, so the ADC must have a dynamic range of 4×10⁴, or about 15 bits, for high accuracy operation. Another common system, the Canberra LEGe Detector with Model 2008 POF preamplifier, produces 20 mV steps for 6 keV x-rays with a 4 Volts range, which requires 14 bits of ADC dynamic range.

Combining these requirements produces a specification for at least a 14 bit ADC operating at 20 MSA or greater rates.

Such ADCs exist, but they are currently expensive compared to the cost of the analog electronics which we want to replace. Fast 8 to 10 bit ADCs, however, have become quite inexpensive due to the recent explosion of DSP techniques in the communications industry. In the present invention, by subtracting a generated low frequency waveform from the preamplifier's output signal, we reduce its dynamic range sufficiently to allow the use of these cheaper devices.

The cost savings can be significant. At the present time, for example, approximate prices for 20 MSA ADCs are as follows: 8 bits - $3 to $5; 10 bits - $10 to $20; 12 bits - $100 to $250; 14 bits - over $900. It is therefore extremely cost effective to be able to employ a 10 bit device in place of a 14 bit device. Achieving this goal was a primary motive in the design of the ASC fraction of the present invention.

The reduction from 14–15 bits to 8–10 bits is also advantageous in the system's digital processing sections because shorter word lengths are less expensive to process at a given data rate, further increasing the cost effectiveness of the final system. Savings arise from two factors. First, the required number of electronic processing elements (flipflops, memories, etc.) scales directly with the number of bits. Even more important, the time to perform operations like subtraction and multiplication increases rapidly with number of bits. Therefore, achieving equal processing speeds with more bits requires using a faster technology, which typically is both more expensive and consumes more power (ECL logic vs CMOS, for example).

2. System Overview

FIG. 2 shows the basic structure of the digital spectrometer, which is described in detail in the above-referenced application of William K. Warburton et al., entitled "METHOD AND APPARATUS FOR DIGITALLY BASED HIGH SPEED X-RAY SPECTROMETER" (Attorney Docket 17032-1-2). Input is from a conventional detector-preamplifier 20, such as is represented in FIG. 1A and described above. It feeds into a digital spectrometer 22, which comprises four primary functional blocks: the invention analog signal conditioning (ASC) block 23; an analog-to-digital converter (ADC) and digital-to-analog (DAC) control block 24; and the digital spectrometer comprising two major functional blocks: a hardwired digital filter, peak detector, and pileup inspector (FiPPI) block 25; and a programmable digital computer block 27, which in a specific embodiment is an embedded digital signal processor (DSP), for signal refinement, multichannel signal analysis, ASC control and input/output (I/O) functions. The digital spectrometer 22 connects to a general purpose control computer and interface 28, from which it receives parameter values to control its operation and to which it sends collected spectra. The function of ASC 23 is not absolutely required for the operation of the digital spectrometer blocks 25 and 27, but is particularly advantageous for its practical implementation, as will be made clear by the following specification. The functions of blocks 25 and 27 can be implemented using various circuitry, but in our preferred embodiment are implemented according to the teachings of the above-referenced application. The general purpose control computer and interface 28 are conventional and may include any of a variety of common personal or laboratory computers and interface standards. The details of interfacing a computer to a DSP are well known to those skilled in the art of digital electronics.

The relations between the functional blocks of the digital spectrometer 22 are also indicated in FIG. 2. The spectrometer receives its input from detector-preamplifier module 20 and delivers complete x-ray spectra to general purpose control computer 28. The flow of signals and control within the spectrometer are indicated by the heavy lines connecting the functional blocks. Thus the ASC 23 accepts an analog signal from block 20 and conditions it for analog-to-digital conversion in ADC block 24, which outputs a digital replica of the same signal to the FiPPI 25. Values of this digital signal can also be captured directly by the DSP 27. The DSP 27 sets parameter values for both the ASC 23 and FiPPI 25, to control their operation, the former being first converted into analog signals by ADC block 24. The DSP 27 receives filtered amplitude values captured by the FiPPI 25 and uses them to compute x-ray energy values, which it bins to produce a multichannel spectral analysis (MCA) of the incident x-ray energies. When data collection is complete, DSP 27 sends its collected spectrum to control computer 28. Prior to the start of data collection, such required control parameters as gain, filter shaping times, pileup inspection levels, etc., are downloaded to the DSP 27 from the control computer 28.

3. ASC High Level Description

FIG. 3 is a functional block diagram of ASC block 23 and ADC and control DAC block 24. An amplifier 30 accepts an input signal from the detector-preamplifier 20 and amplifies the difference between it and the voltage level set by a digital-to-analog converter (DAC) Bias DAC 32. This allows the preamplifier signal to be centered about zero in the rest of the circuit, allowing maximum gains relative to the fixed amount of amplifier noise. A subtractor 33 subtracts the output of a LFF generator 35 from amplifier 30's output. LFF generator 35's output waveform is controlled by inputs from an Offset DAC 37, a Slope DAC 38, and a reset line 40 directly from the DSP 27. Subtractor 33's output feeds a variable gain amplifier 42, whose gain is controlled by a Gain DAC 43. A comparator 44 examines the signal and alerts the DSP 27 on interrupt line 45 if it passes outside the ADC's input limits. A low pass filter 47 removes any signal frequencies above the ADC's Nyquist limit before it reaches an ADC 48.

The ADC output connects both directly to FiPPI block 25 via a digital ADC output bus 50, and indirectly to DSP block 27 via a set of bus buffers 52. The buffers 52 attach to the bidirectional DSP data bus 53, the DSP address lines 54, and the reset line 40. By appropriately loading values onto DSP address lines 54 and writing or reading DSP data bus 53, DSP 27 can load digital input values to the DACs 32, 37, 38, and 43, and sample the ADC output data stream on ADC output bus 50 as desired. Thus it both directly controls all the ASC 23's functions and can also directly measure the effect its actions on the ADC output 50. With appropriate control software, this creates the functionality allowing DSP block 27 first to initially set up preferred operating values for the ASC 23's overall gain and front end offset and then to dynamically control the LFF generator 35's operation as well. The details of using buffers to interface buses and ADCs to a DSP are well known to those skilled in the art of digital electronics and will not be described further.

4. Philosophy of the Operation of ASC Block 20

The ASC 20 has two primary functions: to reduce the input signal's dynamic range and to adjust its gain to satisfy Eqn. 1. It is based on the principle that the preamplifier signal, as in the examples in FIG. 1C and FIG. 1D, can be decomposed into two components: a "low frequency" signal fraction (LFF), of large dynamic range; and a "higher frequency" signal fraction (HFF) carrying the signal information of interest but with a much smaller dynamic range (as in FIG. 1E). The terms "low frequency" and "high frequency" are primarily for descriptive purposes since, in the present application, the LFF's fundamental frequency is much lower than the frequency bandwidth carrying the HFF signal information of interest. The operationally important concept, however, is that this LFF signal fraction can be described by a relatively small number of parameters, making it possible to generate a reasonably faithful replica of the LFF which can then be subtracted from the input signal. The remaining signal fraction, which will thus be a close approximation to the original HFF carrying the signal of interest, will then have a significantly reduced dynamic range, allowing it to be digitized using an ADC with a significantly reduced number of bits. Thus the two fractions could equally well be labeled as "parametrically describable"(PD) and "signal of interest" (SOI), which would be a more functional description.

The ASC 23 therefore functions by accepting a set of control parameters from the DSP 27, using them to generate a LFF replica, subtracting this from the input signal, and then adjusting the gain of the remaining HFF replica to meet Eqn. 1. Besides reducing the number of required ADC bits, this approach has three additional advantages. First, since the DSP 27 knows the ASC's control parameters, it can use them as required to refine the energy spectrum it is collecting. Second, since x-ray pulses in the HFF fraction will fall relatively randomly (dithered) across the ADC's input range, the digital spectrometer's accuracy and linearity become relatively insensitive to the ADC's differential and integral non-linearity and completely insensitive to any DC offset voltages. Third, different types of preamplifier input can be accommodated merely by parametric adjustments. For CD preamplifiers, the LFF is merely a constant set to the value $V_{avg}$, as shown in FIG. 1C; for PR preamplifiers it is a sawtooth function, consisting of alternating ramps of slope $S_{avg}$ and resets, as shown in FIG. 1D. Further discussion of these points may be found in the following specification.

Thus it is clearly advantageous to have the LFF generator 35 controlled by externally supplied parameters so that its output can adaptively track changes in the preamplifier output (i.e., changes in $I_{in}$) in time. These control parameters can be generated by a variety of techniques. In one embodiment, for the CD preamplifier case, the value of $V_{avg}$ is obtained for the LFF by passing the preamplifier output through a low frequency filter. In another embodiment for the PR amplifier case, a manually adjusted current is integrated using a second resettable integrator (essentially replicating the function of the preamplifier) to generate a sawtooth voltage function.

These embodiments, however, are not the preferred embodiment for an ASC intended to operate as part of a general purpose, digitally based spectrometer. In this case, as shown in FIG. 3, it is particularly advantageous to generate the LFF under digital control so that its characteristics can be fully known to, and/or controlled by the DSP block 25. Since a general purpose spectrometer should be able to function with both common preamplifier types, it is useful for the ASC to be able to generate either DC or ramp waveforms, or any combination thereof. This is therefore the preferred embodiment, which will be demonstrated in the discussion of LFF generator block 35. Further, because it is desirable to be able to employ the digital spectrometer with x-rays whose energies vary over a wide range, it is also useful to be able to adjust the system's gain. In keeping with the overall design philosophy of the digital spectrometer, the gain stages are therefore implemented in variable gain amplifier 42 in a manner which allows them to be controlled digitally.

5. Specific Embodiments of the ASC Analog Subsection Blocks

Figure 4:
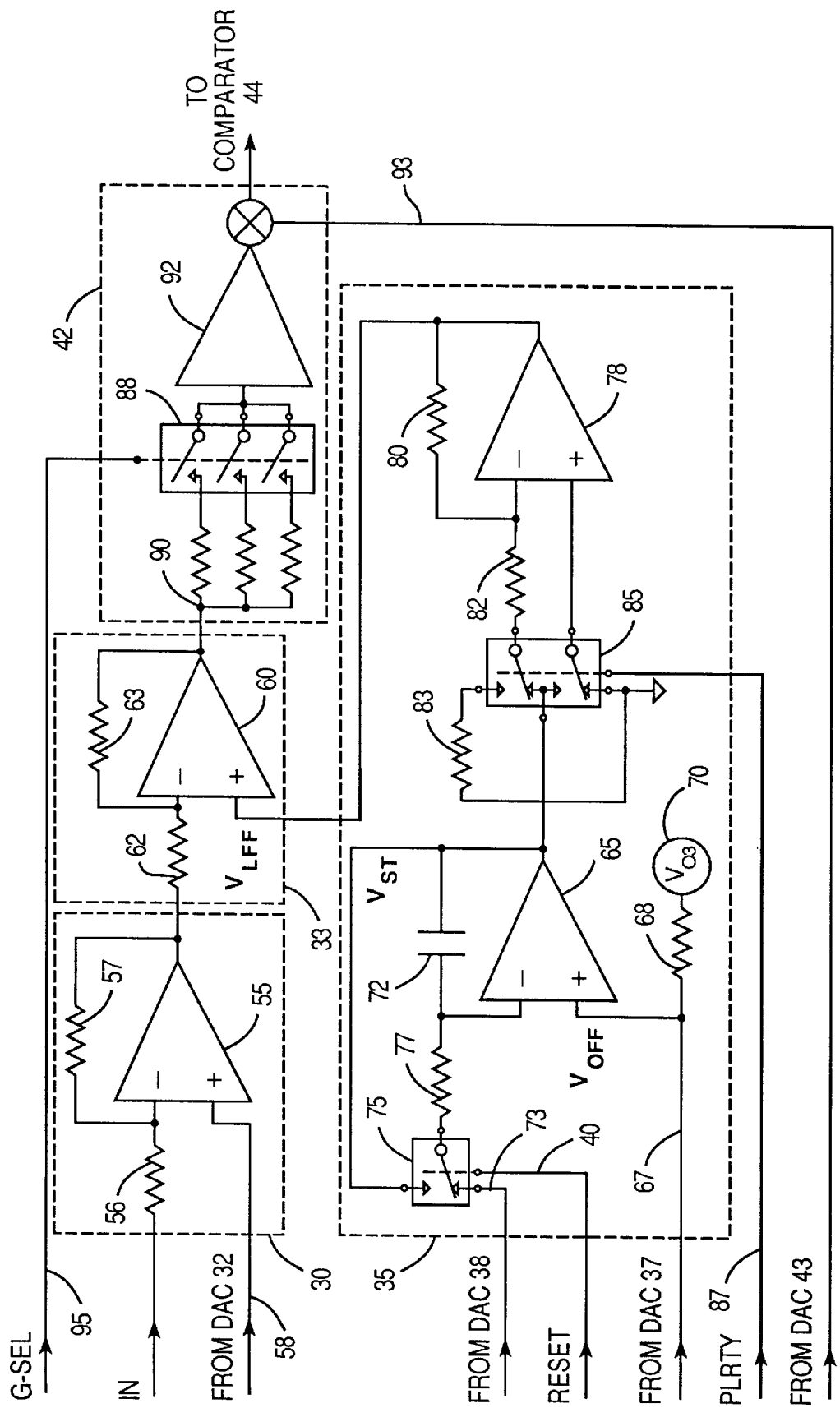
FIG. 4 is a circuit schematic of a representative embodiment of several blocks of FIG. 3.

FIG. 4 is a circuit schematic of the amplifier 30, subtractor 33, LFF generator 35, and variable gain amplifier 42 blocks of Analog Signal Conditioner 20. Those circuit details which are well known to those skilled in the art, such as power supply filtering and op-amp compensation or bandwidth limiting, are not shown.

5.1. Amplifier 30

Amplifier 30 is implemented by a voltage feedback operational amplifier 55 with a gain resistor 56 and a feedback resistor 57. A voltage level 58 from Bias DAC 32 is connected to the positive terminal of the amplifier 55. The typical preamplifier feeding into this circuit does not operate symmetrically about zero volts and voltage level 58 is used to remove this average offset bias. This allows amplifier 55 to operate with the maximum possible voltage swing, which is important in optimizing signal to noise.

Amplifier 30 is implemented both to buffer the ASC circuitry from the preamplifier and to simplify meeting noise performance requirements. The general noise requirement for ASC block 20 is that it does not excessively increase the rms noise of the input signal. In common spectroscopy applications an increase of order 1% or less would be generally acceptable. The common Ortec preamplifier, noted above, outputs 5–6 mV pulses for 6 keV x-rays and has an rms noise of 200 $\mu$V. In order for the ASC to increase this by less than 1%, when added in quadrature, its input referred noise cannot exceed 30 $\mu$V, which is a stringent requirement over a 20 MHz bandwidth. By inserting a properly selected, low noise buffer amplifier 30 with a gain of 3, the input referred noise ceiling of subsequent components is raised to a much more manageable 90 $\mu$V.

Properly selecting amplifier 55 is thus an important design issue. It must have adequate bandwidth so that is does not reduce the risetime of incoming signal pulses, and its noise must be low enough so that it does not add more than about 15 $\mu$V to the input referred signal (leaving room for later stages to add noise as well). In the present implementation this was accomplished using an Analog Devices AD829, a 100$\Omega$ input resistor 56, and a 600$\Omega$ feedback resistor 57. This gives a gain of 3 for the common preamplifier output impedance value of 100$\Omega$.

5.2. Subtractor 33

Subtractor 33 is implemented using a current feedback operational amplifier 60, a gain resistor 62 and a feedback resistor 63. The output of LFF generator 35 is fed to the positive input of amplifier 60. This topology was selected to minimize noise by using a low voltage noise amplifier and minimizing the number of resistors. An Analog Devices AD812 current feedback amplifier works well in this implementation using a 1,500$\Omega$ feedback resistor to limit the bandwidth and a 453$\Omega$ gain resistor. This results in a nominal gain formula of $V_{out}=3.33(V_{in}-1.30\times V_{LFF})$ 5.3. LFF Generator 35

Block 35 is the LFF generator, whose purpose is to generate arbitrary combinations of sawtooth and DC offset voltages. Its general requirements are to do so with a very low noise, to settle to new values in less than 1 $\mu$s when its input parameters are changed, and for its sawtooth to settle in about 5 $\mu$s when reset. Its noise should be minimized since it will be added in quadrature to the signal's noise by subtractor 33. The 1 $\mu$s new value settling time allows the LFF generator to be adjusted without losing excessive amounts of signal processing time, since the signal is invalid during the settling period. The 5 $\mu$s reset time is determined by requiring that the LFF generator reset more quickly than typical PR preamplifiers.

The LFF generator function is built about a voltage feedback operational amplifier 65. The generated DC offset voltage is $V_{off}$, which biases the positive terminal of amplifier 65. $V_{off}$ is created by using a current sinking output Offset DAC 37 connected via line 67 to a resistor 68 connected to a voltage source $V_{O3}$ 70. When the current from Offset DAC 37 is zero, $V_{ff}$ equals $V_{O3}$ and decreases as the current increases. In the specific implementation, $V_{O3}$ is 3.5 Volts, resistor 68 is 3,500$\Omega$, and Offset DAC 37 is an 8-bit Analog Devices DAC-08 with a maximum output current of 2 mA, 200 ns settling time. $V_{off}$ thus can be set to values between +3.5 and −3.5 Volts. To meet the noise requirements, Offset DAC 37 must have its 2 mA current source well filtered. In this implementation this current source was generated by connecting a two stage RC filter, each stage consisting of a 2.5 KΩ resistor and a 0.1 μF capacitor, to a 10 V constant voltage source. Voltage source $V_{O3}$ 70 requires filtering as well, since its noise appears directly as part of $V_{off}$.

The LFF sawtooth voltage is generated by integrating a current on feedback capacitor 72. A current on line 73 comes from current output Slope DAC 38 and is connected to capacitor 72 by a switch 75 through a resistor 77. The voltage is reset on command from DSP block 27 via reset signal 40, which closes the normally open pole of switch 75, shorting out capacitor 72 through resistor 77. The value of resistor 77 is selected so that the slew rate of amplifier 65 is not exceeded during the reset. When reset line 40 is released, capacitor 72 resumes charging. If the LFF generator is only supposed to generate a constant DC offset voltage, the reset line 40 can be held permanently asserted. In normal operation with a PR preamplifier, DSP block 27 adjusts Slope DAC 38 so that the slope of the generated ramp just matches the average slope coming from the preamplifier and adjusts Offset DAC 37 so that $V_{off}$ equals VL, the preamplifier's output voltage immediately after a reset (see FIG. 1D).

The operational amplifier 78 has two functions. The first is to match the output voltage range of amplifier 65 to the range of signals seen at the input to amplifier 60. The second is to be able to switch the polarity of the LFF signal to accommodate various commercial preamplifiers. Gain matching is primarily an issue of practical circuit design in this embodiment. The LFF amplifier 65 must have very low input and offset currents in order to be an accurate integrator and also have sufficient bandwidth to meet reset time requirements. Thus a high speed precision FET input op amp is required. The Maxim 410 is a very good part for this application, but operates from ±5 V supplies and will only swing ±3.5 V. The input buffer amplifier 55 operates from ±12 V supplies and will swing ±10 V easily. Hence additional gain from amplifier 78 matches these two circuits. In this specific embodiment, a gain of 2 is used. Amplifier 78 is an Analog Devices AD812 with a feedback resistor 80 of 1500Ω to limit its bandwidth, and two resistors 82 and 83 equal to 750 Ω to produce gain 2 in inverting and non-inverting topologies. The switch 85 can be implemented in a variety of ways, from on-board jumpering to a digitally controlled switch, depending upon how much total digital control is desired. This switch needs to be changed only when the preamplifier is changed. The Maxim MAX303 precision analog switch works well with a TTL polarity control signal 87, which allows all the ASC units in a module to be switched in unison.

5.4. Variable Gain Amplifier 42

Variable gain stage 42 comprises a coarse gain selection via a switch 88 and resistors 90 and a fine gain stage via voltage controlled gain amplifier 92. Amplifier 92's gain is controlled by a voltage on line 93 from Gain DAC 43. The parallel resistor topology used in the coarse gain stage is set by the amplifier 92, which is an Analog Devices AD603 and has a 100Ω tapped input resistor chain. The resistors 90 thus act like stepdown resistors. If a voltage feedback style amplifier were used for amplifier 92 then the resistors 90 would be in series with taps selected by switch 88. The AD603 is particularly suited to this application since its bandwidth is gain independent and its gain adjusts linearly in dB over a range of 40 dB with changes in the control voltage. This range would be appear to be adequate for the ASC without a coarse gain control, but the AD603 has output noise which is independent of gain and the best spectroscopic performance is obtained by only using the top 10 to 15 dB of the AD603's adjustment for fine gain control and using a resistor divider, which has much lower noise, for the coarse gain. The input control voltage on line 93 is created using current output Gain DAC 43 in a manner similar to that used to create the $V_{off}$ input to amplifier 65. In the specific embodiment, switch 88 is a pair of Maxim MAX301 precision analog switches, the resistors 90 have values of 100, 300, 700 and 1500Ω, and are selected by a pair of logic signals G-Sel 95 set by DSP block 25. This implementation is not unique and many other suitable arrangements can be readily devised by those skilled in the art of analog electronic design.

5.5. Comparator

The remaining blocks in the ASC section 20 of FIG. 3 are straightforward to implement for anyone skilled in the art of electronics. They consist of a comparator section 44 and a low pass filter 47.

The comparator section 44 is required due to the random rate of arrival of x-rays to the detector diode 10. Once the voltage $V_{LFF}$ has been subtracted from the preamplifier signal by amplifier 60 and the gain set using switches 88 and variable gain amplifier 92, then a specific range of preamplifier voltages, ΔV, is mapped onto the input voltage range of ADC 48. As a result, any count rate fluctuation which causes the preamplifier voltage to exceed ΔV causes the ADC to output spurious data which are either all 1's (out of range high) or all 0's (out of range low). With proper design, it is possible to ensure that fluctuations this large occur relatively rarely, but it is still necessary to detect them and signal DSP block 27, so that the spurious data can be rejected. The only design issue is that the comparator be fast enough so that it will signal the out of range condition to the DSP in a time less than it takes to process the bad data. In the specific embodiment this detection is implemented using a pair of National LM319 comparators with appropriate comparison levels set using resistor dividers. In other embodiments the ADC may implement these functions directly using internal overflow or underflow detection.

5.6. Low Pass Filter 47

The low pass filter 47 is required to limit the bandwidth of the signal output by the ASC analog section 20 to less than half the sampling frequency of the ADC 48 in order to satisfy the Nyquist criterion. Otherwise, as is well known from applications of digital sampling to communications, but appears to have been overlooked in other attempts to construct digitally based x-ray spectrometers, any noise frequency higher than the Nyquist frequency will be "aliased" into the digitized output signal, unnecessarily increasing its noise. The Nyquist frequency is the sampling frequency divided by 2. In this specific embodiment, the ADC is an Analog Devices AD876 operating at 20 MHz so its input signal must be bandwidth limited to less than 10 MHz. While a wide variety of filter designs could be employed for this purpose, in the specific embodiment a 4-pole Butterworth filter is used for its combination of fast rolloff in frequency, coupled with minimum peaking in time. This filter was found to perform well, dropping off fast enough in the frequency domain to serve its noise reduction function, yet only requiring four passive components. Designing its impedance to be about 200Ω, rather than the more common 50Ω, allows the use of still smaller and cheaper components. By adjusting both the impedance and 3 dB frequency slightly, it is possible to implement the filter using entirely standard inductance and capacitance values. In the specific embodiment, the characteristic impedance is 191Ω, which is achieved using inductors of 5.6 $\mu$H and 2.2 $\mu$H and capacitors of 62 pF and 150 pF. Mica capacitors are used because of their good high frequency characteristics. Following the filter, a buffer operational amplifier both terminates the filter at its characteristic impedance and isolates it from the ADC 48. This amplifier also accomplishes the level shifting required to match the zero referenced filter output to the 2 to 4 V input range of the Analog Devices AD876 used as the ADC 48 in the specific embodiment. A gain of 2 in this amplifier compensates for losses in the filter preceding it.

We have experimentally verified that this filter is necessary for optimum performance and, further, that if the Nyquist criterion is satisfied, then the spectrometer's energy resolution, which is the direct measure of its noise performance, depends only on the shaping time implemented and not at all on the ADC's sampling frequency. Thus embodiments using ADC sampling at 2, 5, 10 or 25 MSA, with lowpass filters of 1, 2.5, 5 and 12.5 MHz respectively, all produced identical energy resolution for triangular filtering with 2 $\mu$s peaking time, even though the number of data samples collected in the different systems varied from 8 in the 2 MSA case to 100 in the 25 MSA case. The several authors who have reported improvements in energy resolution with increased sampling rates have clearly failed to satisfy the Nyquist criterion. Selecting a sampling rate, then, depends primarily on tradeoffs between achieving good pulse pair resolution, which high sampling rates favor, and minimizing digital processing costs, which low sampling rates favor.

6. Design Issues in Implementing the ASC

The first important design issue is to recognize that slow drifts and lack of absolute DC accuracy in the ASC's output are not a problem because ASC 23 operates in a feedback loop controlled by DSP block 27. This fact is taken into account wherever possible to reduce the cost of the design.

Second, in designing the slope generator, a balance has to be found between two competing requirements. On one hand it is desirable to use a large integrating capacitor 72 and input currents 73 which are always large compared to the leakage currents of switch 75. On the other hand, a large capacitor 72 takes a long time to reset without exceeding the slew rate of amplifier 65 and this reset time should not exceed that of the resetting preamplifier if no additional counts are to be lost during the reset process. In the specific implementation a Maxim MAX319 with 1 nA leakage and 30Ω on resistance is used for switch 75, an integrating capacitor 72 of 0.01 $\mu$F, and a current limiting resistor 77 of 250Ω. This results in a reset RC time constant of 2.8 $\mu$S and allows currents in the range of 45 nA to 45 $\mu$A to be used to generate sawtooth ramps capable of handling up to 500,000 counts/sec of 6 keV x-rays. At the fastest rates a typical preamplifier will be resetting about once per millisecond, so that a 20 $\mu$S reset is long enough to allow good settling (7 RC time constants) but short enough so that only 2% of counts are lost.

The third important issue concerns selecting the number of bits in Slope DAC 38, which drives the LFF's slope generator. The basic question is how closely the LFF generated ramp voltage has to match the preamplifier's average ramp voltage for acceptable operation. The specific implementation uses a 10-bit current output Slope DAC 38 to control generated slopes. Since 10-bits corresponds to 1024 equally spaced settings and the maximum slope designed for is 500,000 counts/sec (cps), then the settings occur at 500 cps intervals and any given input slope can be matched ±250 cps. At the highest count rates, when preamplifier resets occur about every 1 ms, the average and generated slopes will deviate by less than 0.5 count before resetting, which will not result in any noticeable increase in reset rate. At lower rates, greater divergences will occur, since the time between resets is longer but, for the same reason, the fractional time lost to these resets will also get less. For example, at 5,000 cps, preamplifier resets will occur about every 100 ms. During this time the divergence between average and generated slope will exceed the dynamic range at the ADC input about 5 times, losing about 100 $\mu$S, or only 0.1%, to these additional resets. This analysis shows that a 10-bit DAC is adequate to control the slope generator in this specific embodiment.

7. Supplying ASC Control Parameters

As is clear from the preceding discussions, the utility of the ASC is maximized if its control parameters are adjusted dynamically. In the case of a CD preamplifier, this means adjusting the DC output level from function generator 35 to track changes in input counting rate, as reflected in changes in $I_{in}$. In the case of a PR preamplifier, this minimally requires both adjusting the slope generator to track changes in the input counting rate and resetting the generator each time the preamplifier resets. It is also quite clear, given an understanding of both the operation of the ASC and typical preamplifier systems, that systems could easily be devised, by those skilled in the art, to generate such time dependent control parameters using analog electronics techniques. Indeed, as noted in Section 4, we have done so ourselves in particular embodiments devised as part of our developmental research.

However, as also noted earlier, there are significant advantages to having digital ASC control parameters and having their values supplied by the DSP 27 in a control loop. To accomplish this effectively, two control procedures were devised for the preferred implementation. The first is to deal with situations where the output of ASC 23 exceeds the input range to ADC 48, which we will call the "ADC Out of Range Condition." The second procedure is used to update the DSP's estimate of the ramp slope, which it uses to set the value of the Slope DAC 38, so that the system can effectively track changes in input counting rate.

8. Fixing ADC Out of Range Condition 8.1. Description of the Problem

The ADC out of range condition occurs for two primary reasons. The first, which occurs only with PR preamplifiers, is due to the preamplifier resetting. While many preamplifiers provide a reset signal which could be used to notify the DSP block 27 that a reset signal has occurred, some do not and it is therefore useful to have a procedure capable of coping with the general situation, if possible. It can be readily simplified for those cases when a hard wired reset signal is available and implemented. The second source of out of ranging is more subtle and arises from random fluctuations in the input counting rate due to the statistical nature of radiation sources. This problem is described in the following paragraphs.

The issues associated with random fluctuations in counting rate may be understood by reference to FIGS. 5A–5D. These data were collected from the output of a prototype ASC attached to a PR detector-preamplifier system of the pulsed optical feedback type. The detector was exposed to a nuclear source of Fe-55 x-rays (5.9 keV), which produced steps of approximately 45 mV at the ASC output. The slope of the ramp generated by the LFF generator 35 was adjusted to match the average x-ray arrival rate. The "average" output is much as shown in trace A in FIG. 5A, where x-rays arrive randomly (the vertical steps) and the LFF generator ramp is subtracted continuously (the sloped lines between the steps). Because the x-rays arrive randomly, we also expect that there will be periods when the x-rays arrive faster (trace B in FIG. 5A) or slower than average (trace C in FIG. 5A) for brief periods but we expect that these fluctuations will shortly be canceled out, as also seen in those two traces. We therefore expect that we should be able to set the ASC gain so that there will be some upper level (UL) and lower level (LL) beyond which the excursions will seldom go. In FIGS. 5A–5D, these levels are set for illustrative purposes at +0.40 and −0.40 V, about 8 times the step height. Observation of the ASC output shows that the signal usually stays within these bounds. The range UL to LL is then to be matched to the input range of the ADC 48. It is important to note that the random fluctuations of the x-ray signal across this range result in dithering, so that there is no correlation between the height of an x-ray step and where it occurs in the ADC's input range. In this manner the design of the ASC 23 causes the spectrometer's energy linearity to become insensitive to both the differential and integral nonlinearities of the ADC 48. Energy resolution will still be sensitive to these nonlinearities, but will not vary with x-ray energy, as would be the case without dithering.

Figure 5A:
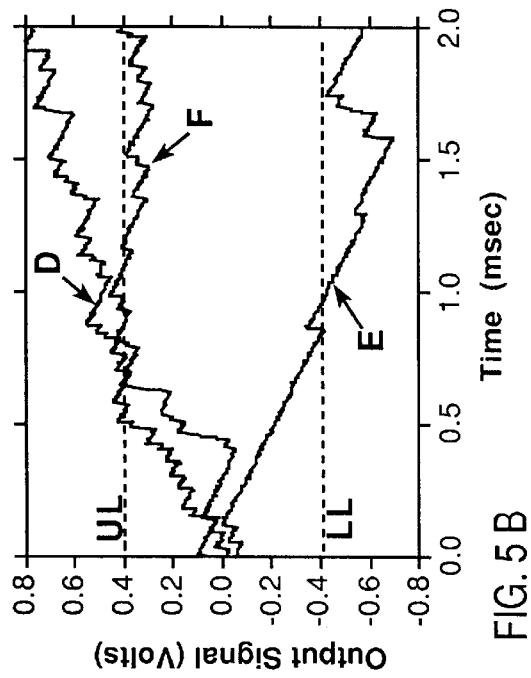
FIGS. 5A–5D are oscilloscope traces of the output of a specific embodiment of the invention ASC showing the effects of time fluctuations in the arrival rate of x-rays.
Figure 5B:
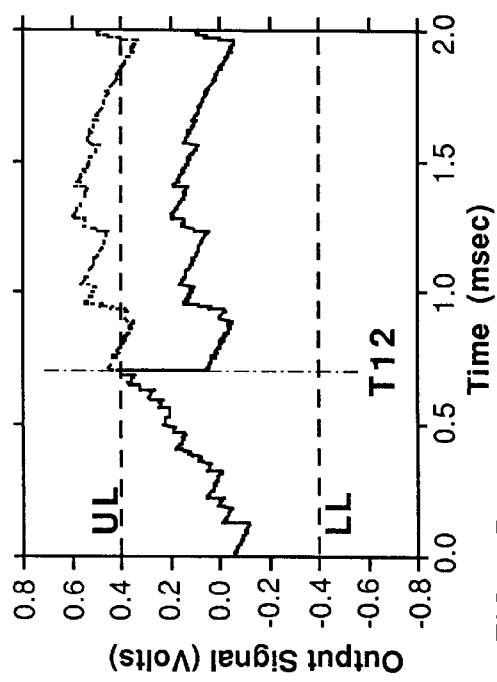

Simply matching the range LL to UL to the input range of ADC 48 is not a complete solution, however, since the arrival rate of the x-rays is in fact truly random. This means, just as tossing a coin "heads" 6 times in a row does not imply any greater than average probability of tossing "tails" on the 7th try, that the arrival of a faster (or slower) than average burst of pulses does not imply that the next set will either slower (or faster) than average. Examples of these situations are shown in FIG. 5B. In trace D in FIG. 5B an above average arrival rate for 1 ms is followed by another above average arrival rate for another 1 ms. Trace E in FIG. 5B shows a similar, slower than average situation. Trace F in FIG. 5B shows the case of an above average arrival rate for 1 ms followed by an average rate for the next 1 ms. All of these cases exceed the UL and LL limits described earlier. Since it is known that random walks in one dimension are unbounded, it is therefore true that no matter how large UL and LL are set they will always be exceeded eventually, although the time between such events can be made very large by making UL and LL large. The issues, therefore, are how large to make UL and LL and how to deal with excursions when they do occur.

8.2. Setting the LL to UL Range

The following discussion will be restricted to the PR preamplifier case, which is harder since it involves resets. Those skilled in the art will understand how to deal with the CD preamplifier case, using the principles developed here and a few comments at the end of Section 8.3. We first observe that each time there is a reset we get to start over again at the center of the LL to UL range because PR preamplifiers reset to a known voltage and we can adjust Offset DAC 37 so that this voltage maps to the center of the LL to UL range. Our first problem, therefore, is to set the LL to UL range so that excursions do not occur too often per reset. We analyzed this problem using a computer program to model the random arrival of x-rays and counting the typical number of times an out-of-range occurred per reset as a function of the ratio R of the x-ray step height to the magnitude of the LL to UL range. When the preamplifier reset every 200 x-rays, for example, we found that for R equal to 1/16 we got about 3 out-of-ranges per reset. R values equal to 1/20, 1/24, and 1/28 produced 2, 1.5 and 1 out-of-ranges per reset, respectively.

Since an out-of-range adjustment to Offset DAC 37 takes less than 2 µs, compared to 10–20 µs to reset the preamplifier, our computer model shows that the LL to UL range should normally be set to between 16 and 32 times the size of a single x-ray step. This will results in range excursions between 3 and 1 times per normal reset. Making the LL to UL range smaller increases counting time losses to out of range events while making it larger both reduces the dynamic range of the ASC 23 and increases the digitization noise in the ADC 48 signal, both of which are counter to our design goals. We observe that, in the examples shown in FIGS. 5A–5D, an x-ray step is 45 mV and the LL to UL range is 0.8 V, for an R value of 18. Here one bit of a 10 bit ADC corresponds to 1.7% of the x-ray step height. At the preamplifier output in these measurements the x-rays' step height was 22 mV with a range of 4.7 V. To achieve this same 1.7% resolution of 22 mV over 4.7 V by direct digitization would require a dynamic range of 12,600, or 13.6 bits. Thus the number of required ADC bits has been reduced from 14 to 10, illustrating one of the benefits of the present invention.

We also know from experience that excursions beyond UL and LL also occur for other reasons. For example, absorption of cosmic rays or, in the synchrotron environment, high energy gamma rays in the detector will cause UL to be exceeded. Resets are an obvious and regularly occurring case where LL is exceeded. Therefore our procedure should provide for the following cases. Case 1: the output crosses UL as a result of an extended fluctuation in count rate (small jumps across UL). Case 2: the output crosses UL due to a cosmic ray or similar event (large jump across UL). Case 3: the output crosses LL as a result of an extended fluctuation (small jumps across LL). Case 4: the output crosses LL as a result of a reset (large jump across LL).

8.3. The Procedure to Fix ADC Out-of-Range Condition

Figure 5C:
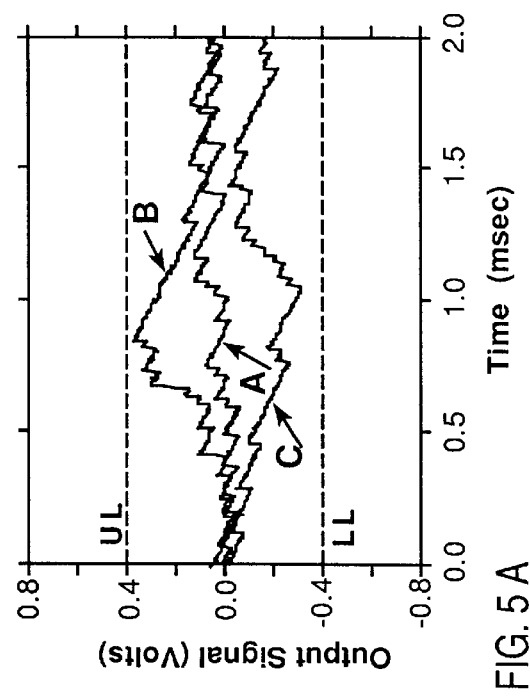
Figure 5D:
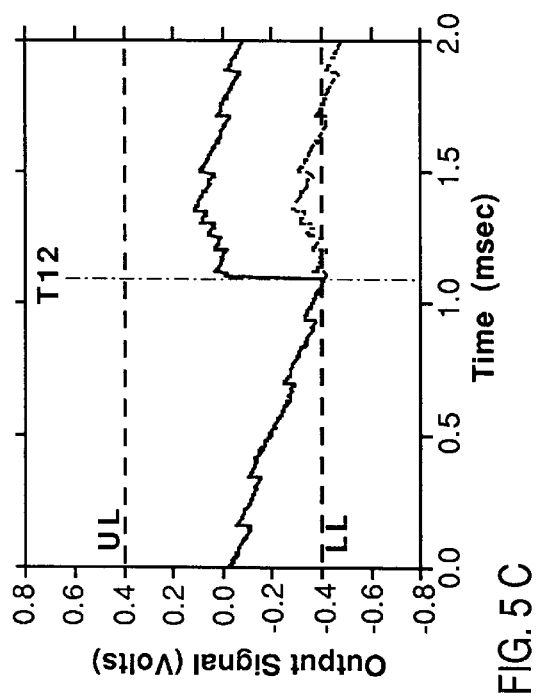

If the range UL to LL has been properly matched to the input range of the ADC 48, then, according the design of the ASC 23 described above, any deviation of the signal from this range will be detected and signaled to the DSP block 27 by the comparator 44. The DSP block 27 can then adjust the LFF generator 35 to return the signal to the ADC's permissible input operating range. To accomplish this, the following procedure was developed. First, consider excursions which exceed LL, as shown by the dashed trace in FIG. 5C for times beyond $t_{12}$. Except in very unusual environments, the most likely cause of this excursion is a count rate fluctuation. The signal is therefore probably just beyond LL and a simple change in the value of $V_{off}$ using Offset DAC 37 will recover it. The effect on the signal is shown by the solid trace in FIG. 5C, which jumps back close to the center of the LL to UL range for a step in $V_{off}$ equal to a fraction, here one-half, the LL to UL range. Signal excursions exceeding UL are treated similarly, as shown in FIG. 5D.

Suppose, however, that a single $V_{off}$ step does not return the signal to its proper range. This may be termed an "upset" event. If the signal originally fell below LL and the shift shown in FIG. 5C does not recover it, then the next most likely probability is that the upset was caused by a preamplifier reset. In this event, the DSP block 27 should completely reset the LFF generator 35 by discharging the integrating capacitor 72 and returning $V_{off}$ to its standard value. If, on the other hand, UL was originally exceeded and the shift shown in FIG. 5D fails to recover it, then most likely a cosmic ray caused the upset. In this case the signal could be anywhere in the input amplifier's range (if the event is too large, of course, it will force a preamplifier reset) and it must be searched for. One possibility is to use a binary search. Because the digital spectrometer could, in principle, know both how long it has been since the LFF generator 35 was last reset and the value of the slope being generated, it could compute how much of the preamplifier's input range remains and jump to the halfway point of this region. The comparator 44 will tell whether the signal is now in range or not. If in range, an ADC reading will allow DSP to then center the signal in the range. If out of range another step bisecting the remaining range can be taken and the process iterated until the signal is found.

Another approach was implemented in the specific embodiment, which is to simply step in the appropriate direction using steps which are a significant fraction of the full range. This is both simple to code and captures the signal fairly quickly. This may be seen by noting that the typical the LL to UL range is about 20 x-ray steps (ratio R in Section 8.2 is 1/20) while the typical preamplifier reset range is about 200 x-ray steps at 6 keV. Therefore the entire range may be covered in only 10 steps and the typical upset event recovered in fewer than 5. $V_{off}$ settles in 1–2 $\mu$s, so the total time lost is not excessive provided such events occur at rates of fewer than one per normal reset. We have also occasionally observed large "negative energy" upsets, in which large downward steps occurred. While we do not understand the source of such events, they will be observed as cases where a reset was expected but afterwards the signal was out of range positive. In such cases the positive cosmic ray search routine can then be used to find the signal.

Figure 6:
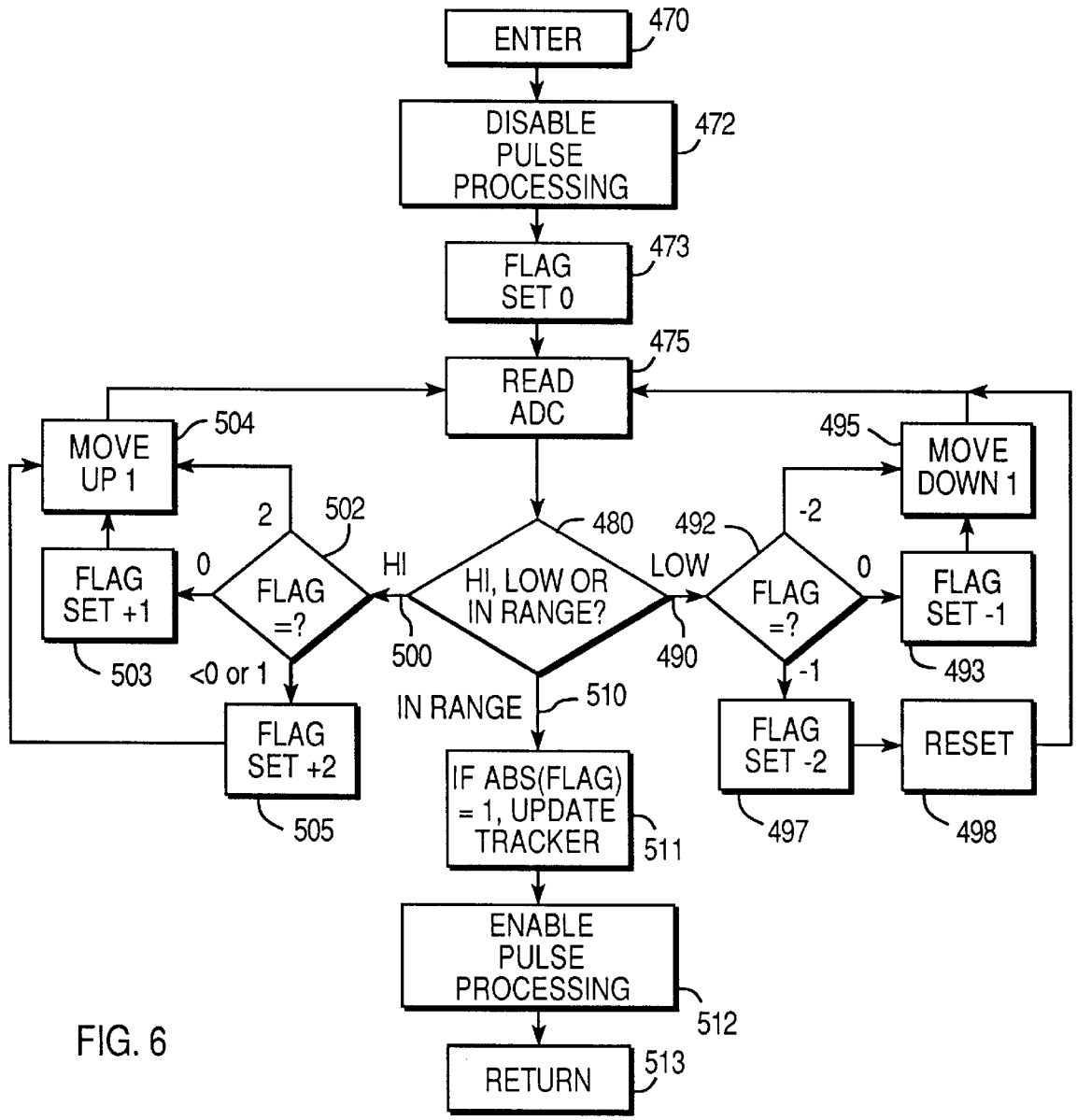
FIG. 6 is a block diagram of a control procedure used to keep the ASC's output within the ADC's input range in the presence of count rate fluctuations.

One implementation of the ASC controlling procedure is therefore as shown in FIG. 6. When the Fix ADC Out of Range Condition procedure is called, the DSP block 27 comes in at Enter 470 and first Disables 472 signal pulse processing because any data received during this period will be invalid. Flag Set 0 473 then sets a flag which will be used to detect upset events. The DSP block 27 next performs Read ADC 475, which directly reads the ADC 48 through bus buffers 52. The program then branches depending upon whether the ADC reading was Hi, Low or in Range 480. If Low 490, the flag value is tested 492. If it is 0 (no previous action) then a "drift low out of range" condition is presumed, flag set to −1 493 is performed, and $V_{off}$ is reduced by one step 495 (one half the LL to UL range), as shown in FIG. 5C, by writing an appropriate change in value to Offset DAC 37. The program then returns to Read ADC 475 to test the effect of this action. If the result of flag value test 492 is −1, then an upset event of the reset type is presumed, the flag is set to −2 497, and a full reset 498 is performed by writing a standard value to Offset DAC 37 and closing switch 75 for a predetermined length of time via reset line 40. The program then returns to Read ADC 475 to test the effect of this action. If the result of flag value test 492 is −2 (which would be an abnormal condition since the ADC should be in range and centered after a reset, by definition) the program attempts to locate the signal by moving down another place and returning to Read ADC 475 to test the effect of this action. While it would obviously be beneficial to track and report the number of such abnormal events, doing so is not fundamental to the performance of the procedure.

If the result of the Hi, Low or in Range 480 test is Hi 500, then the flag value is tested 502. If it is 0 (no previous action) then a "drift high out of range" condition is presumed, the flag set to +1 503 is performed, and $V_{off}$ is increased by one step 504, as shown in FIG. 5D, by writing an appropriate change in value to Offset DAC 37. The program then returns to Read ADC 475 to test the effect of this action. If the result of flag value test 502 is +1, then an upset event of the cosmic ray type is presumed, the flag changed to +2, 505, $V_{off}$ is increased by another step, and the program returns to Read ADC 475 to test the effect of this action. If the result of flag value test 502 is less than zero, then a reset action has overshot the mark. This is an unusual event, so the flag is set to +2 before the $V_{off}$ adjustment is made.

If the result of the Hi, Low or in Range 580 test is In Range 510, then the signal has been found. If the value of the flag is either +1 or −1, then the event which caused the Fix ADC Out-of-Range routine to be called was a simple drift high or low out of range. In this case a procedure is called to update tracker 511, which updates the current estimate of the best value for the Slope DAC 38 setting, as described in Section 9 below. The system is now ready to return to data collection. The DSP's 27 pulse processing is re-enabled 512 and the procedure Returns 513 to the point in the program from which it was called.

This procedure, as presented, is primarily appropriate for a PR preamplifier. Because the CD preamplifier does not have resets, the reset part of the procedure becomes unnecessary. In addition, the amount by which $V_{off}$ is changed should be adjusted to optimize performance. In the short term, for a PR preamplifier, the signal is approximately as likely to go further down as up, and $V_{off}$ should therefore be changed so that the signal is approximately centered in the LL to UL range, as shown in FIG. 5C. For CD preamplifiers, however, where the discharge rate is proportional to the deviation of the signal from zero, the signal will tend to be forced back to its average value (i.e., eventually come back into range of its own accord) and so that $V_{off}$ should not be changed quite so much.

9. Procedure to Update the Slope DAC 38 Setting Estimate

When the Slope DAC 38 is set correctly, then, on average, out-of-range excursions should be equally likely in the Hi and Low directions. On the other hand, if the rate of the incoming x-rays changes, then the Slope DAC will need to be adjusted appropriately. The following procedure collects statistics on these excursions and determines whether an adjustment to the Slope DAC setting is required. Because, in a general mode of operation, the DSP block 27 will be able to measure the slope prior to starting to collect data and compute an estimate of the correct setting for Slope DAC 38, we expect that only small adjustments will be required except in situations where the incoming count rate is changing radically for some reason.

In the specific embodiment we have therefore implemented the following procedure to compute a weight W based on the recent history of Out-of-Range conditions encountered. At each entry into the "update tracker" 511 routine of FIG. 6, if the flag value is ±1, W is updated according to the formula:

$$W_i = ((N-1)/N) \ W_{i-1} + V_i/N \tag{3}$$

where $V_i$ is the flag value and equals +1 or −1 for Hi or Low Out-of-Ranges, respectively. Then $W_i$ is tested and, if its magnitude exceeds a test value V, it is set to zero and the Slope DAC 38 is adjusted by one unit in the appropriate direction. If the magnitude of $W_i$ is less than V, then the Slope DAC is presumed to be adequately adjusted, no changes are made, and the program moves on.

While, mathematically, other forms than Eqn. 3 could be used to compute the weight $W_i$, including, for example, running averages, Eqn. 3 is advantageous for several reasons. First, it causes the weight of recent observations of $V_i$ to decay exponentially as they recede into the past so that, in a time evolving situation, the most recent observations are counted most heavily. Second, as opposed to such formalisms as running averages, Eqn. 3 does not require the storage of previous observations. This minimizes both the memory and computational resources required to update $W_i$. Third, it can be carried out very rapidly on a fixed point DSP if the ratios are powers of 2 by replacing multi-operation multiplications and divisions with single operation shifts left and right. For the value N equals 8, which has been found to work well in the specific embodiment, Eqn. 3 may be evaluated in a fixed point DSP by shifting a copy of $W_{i-1}$ left 3 places (multiply by 8), subtracting $W_{i-1}$, and shifting right 3 places to get $B_{i-1}$ times (⅞). Then $V_i$ is shifted right 3 places (divide by 8) and added to obtain $W_i$. No actual divisions or multiplications are required and the entire computation can be accomplished in about 6 machine cycles. This is important because is minimizes the amount of time when the DSP is not available for otherwise processing data.

Combined with the value N equals 8, the specific embodiment has been found to work well using a test value V equal to 0.5. If the Slope DAC 38 is truly out of adjustment, so that all Out-of-Ranges are in the same direction, $W_i$ will exceed 0.5 once every 6 times and so come back into range fairly quickly. On the other hand, when the Slope DAC is properly set, $W_i$ is still damped heavily enough to suppress oscillations in the program's estimate of this setting caused by strings of same-direction Out-of-Range excursions arising from random fluctuations in the x-ray count rate.

10. Conclusion

While the above is a complete description of specific embodiments of the invention, various modifications, alternative constructions, and equivalents may be used. As a first example, while the specific embodiment generates only DC and Slope-Reset Low Frequency Functions, other waveforms might be more appropriate in other applications, or with other preamplifiers. As a second example, while the parameters used to control the Low Frequency Function generator in the specific embodiment are supplied and controlled digitally, it is clear even from the inventor's own experience that they can also be supplied and controlled using analog electronics or a mixture of analog and digital electronics. Therefore, the above description should not be taken as limiting the scope of the invention as defined by the appended claims.

What is claimed is:

1. A method for reducing the number of analog-to-digital converter bits required to extract a digital representation of a signal of interest (SOI) from an original analog input signal (OAIS) which can be decomposed into the sum of a parametrically describable (PD) fraction having a high dynamic range and a remainder signal fraction having a significantly smaller dynamic range, which remainder fraction contains the SOI, the method comprising the steps of:

providing a signal generator, controlled by a set of at least one control parameter, said set being referred to as the control parameter set, capable of generating a class of at least one signal which includes the PD signal fraction as a member;

adjusting said control parameter set so that said signal generator produces a generated signal which is an approximate replica of the PD signal fraction;

generating a difference signal representative of the difference between said OAIS and said generated signal; and digitizing said difference signal to produce a digital representation of said SOI.

2. The method of claim 1 wherein:

said digitizing step is characterized by a sampling frequency; and said step of generating a difference signal includes the steps of subtracting said generated signal from said OAIS and low pass filtering the signal resulting from said subtracting substep to remove frequency components above half said sampling frequency.

3. The method of claim 1, wherein;

said generated signal includes a DC component and a resetting ramp component; and the control parameter set includes a DC offset value and a slope value.

4. A method for producing a digital representation of an original analog input signal (OAIS) composed of a parametrically describable (PD) fraction having a high dynamic range and a signal-of-interest (SOI) fraction having a significantly smaller dynamic range, the method comprising the steps of:

generating a replica of the PD fraction using a set of at least one control parameter, said set being referred to as the control parameter set;

generating a difference signal representative of the difference between said OAIS and said replica of the PD fraction;

digitizing said difference signal;

determining whether said difference signal is within a permissible range; and if not, adjusting said control parameter set by adjusting at least one control parameter value to adjust said replica so as to bring said difference signal into the permissible range.

5. The method of claim 4, wherein said control parameter set includes at least one digital value, the generation and adjustment of which are carried out by a digital computer.

6. The method of claim 4, wherein:

said digitizing step is characterized by a permissible range of input signals; and the permissible range is the permissible input range characterizing said digitizing step.

7. The method of claim 6, and further comprising the step of adjusting the amplitude of said difference signal relative to the resolution of said digitizing step.

8. The method of claim 4, wherein said conditional adjusting step comprises the steps of:

first, determining the direction in which said difference signal departed said permissible range; and second, adjusting at least one control parameter value by an amount that would cause said difference signal to move back toward the center of the permissible range by a fraction of the width of the permissible range.

9. The method of claim 8, and further comprising repeating said adjusting step if said adjusting step does not return said difference signal to said permissible range.

10. The method of claim 8, and further comprising the step, responsive to failures of said adjusting step to return said difference signal to said permissible range, of resetting the replica of the PD fraction to a predetermined value.

11. The method of claim 8, wherein;

the replica of the PD fraction includes a DC component; and said adjusting at least one control parameter value is accomplished by adjusting the value of said DC component.

12. The method of claim 8, wherein the replica of the PD fraction includes a resetting ramp component; and said adjusting at least one control parameter value is accomplished by performing at least one step in the group of steps consisting of (a) adjusting the value of the slope of said ramp component, and (b) resetting said ramp component.

13. The method of claim 4 wherein, in the presence of fluctuations in the SOI fraction, a determination of whether to adjust said control parameter set is made each time said difference signal deviates from said permissible range by the steps of:

multiplying the sign of said deviation by a weighting value to produce a signed weight;

using said signed weight together with similar signed weights collected from past deviations to compute a test quantity; and if said test quantity exceeds a predetermined value then adjusting said control parameter set.

14. The method of claim 13 wherein said test quantity is computed according to the formula:

$$W_i = ((N-1)/N)\ W_i{-}1 + V_i/N$$

where $W_i$ is the value of the test quantity associated with the ith deviation, $W_{i-1}$ is the value of the test quantity associated with the (i−1)th (i.e., preceding) deviation, $V_i$ is the signed weight, and N is a constant.

15. The method of claim 14 wherein N is a power of 2.

16. The method of claim 4 wherein at least one control parameter value of the control parameter set is made available to a device accepting the digital output of the method, and further comprising the step of operating the device to perform at least one of the following steps:

generating its own replica of the PD fraction and combining it with the digital output of the method to approximately reconstruct the OAIS; and computing, and so correcting for, the effects of the removal of the PD fraction, from the OAIS, on any analysis it may perform on the method's digital output.

17. The method of claim 16 wherein:

at least one control parameter is a digital value; and said device is a digital computer.

18. The method of claim 17 wherein:

said digital computer is also used for said determining and adjusting steps.

19. A method in x-ray or gamma-ray spectroscopy for extracting photon energy information contained in an original preamplifier input signal (PAIS) that is characterized by a series of accumulating steps that is intermittently reset, the steps having step heights representative of photon energies, the PAIS thus being composed of (i) a parametrically describable (PD) fraction comprising a resetting ramp, the PD fraction having a high dynamic range, and (ii) a "signal of interest" (SOI) fraction comprising a train of pulses having pulse heights corresponding to the step heights, the SOI fraction being superimposed on the PD fraction and having a significantly smaller dynamic range, the method comprising the steps of:

generating a resetting ramp signal that is an approximate replica of the PD fraction using a set of at least one control parameter;

generating a difference signal representative of the difference between said PAIS and said resetting ramp signal, the difference signal thus being characterized by a dynamic range significantly less than the dynamic range of the PD fraction; and digitizing said difference signal to obtain a digital signal that includes information on the heights of the pulses.

20. An apparatus for reducing the number of analog-to-digital converter bits required to extract a digital representation of a signal of interest (SOI) from an original analog input signal (OAIS) which can be decomposed into the sum of a parametrically describable (PD) fraction having a high dynamic range and a remainder signal fraction having a significantly smaller dynamic range, which remainder fraction contains the SOI, the apparatus comprising:

a signal generator controlled by a set of at least one control parameter, said signal generator, in response to an adjusted control parameter, producing a generated signal which is an approximate replica of the PD signal fraction;

a subtracting stage which generates a difference signal representative of the difference between said OAIS and said generated signal; and an analog-to-digital converter (ADC) which digitizes said difference signal to produce a digital representation of said SOI.

21. The apparatus of claim 20 wherein said ADC is characterized by a sampling frequency; and the apparatus further comprises a filter inserted between said subtracting stage and said ADC, which filter removes frequency components above half said sampling frequency.

22. The apparatus of claim 20, wherein;

the output of the signal generator includes a DC component and a resetting ramp component; and the parameter set includes a DC offset value and a slope value.

23. An apparatus for producing a digital representation of an original analog input signal (OAIS) composed of a parametrically describable (PD) fraction having a high dynamic range and a signal-of-interest (SOI) fraction having a significantly smaller dynamic range, the apparatus comprising:

a LFF generator which generates a replica of the PD fraction, wherein the operation of the LFF generator is controlled by a set of at least one control parameter, said set being referred to as the control parameter set;

a subtracting stage which generates a difference signal representative of the difference between said OAIS and said replica of the PD fraction signal;

an analog-to-digital converter (ADC) which digitizes said difference signal;

a comparator which determines whether said difference signal is within a permissible range; and means, responsive to a determination that said difference signal is outside the permissible range, for adjusting said control parameter set by adjusting at least one control parameter value so as to bring said amplified difference signal into the permissible range.

24. The apparatus of claim 23, wherein said control parameter set includes at least one digital value, the generation and adjustment of which are carried out by a digital computer.

25. The apparatus of claim 23, wherein the permissible range is the permissible input range for said ADC.

26. The apparatus of claim 25, and further comprising at least one member of the group consisting of a variable gain stage and an inverting stage so that the sign of the replica generated by the LFF generator can be matched to that of the PD fraction and the amplitude of said difference signal can be adjusted relative to the resolution of the ADC.

27. The apparatus of claim 23, wherein said means for adjusting includes a digital computer programmed to perform the following steps:

(a) noting the direction in which said difference signal departed said permissible range;

(b) adjusting at least one control parameter value by an amount which would cause said difference signal to move back toward the center of the permissible range by a fraction of the width of the permissible range; and (c) if said step of adjusting does not return said difference signal to said permissible range, then either repeating steps (a) through (c) or invoking additional steps and/or procedures to return the difference signal to the permissible range.

28. The apparatus of claim 27 wherein said additional steps and/or procedures to return the difference signal to the permissible range consist of a repeated sequence of steps (b) and (c).

29. The apparatus of claim 27, and further including means, responsive to one or more failures of said step (b) to return said difference signal to said permissible range, for communicating a reset signal to said LFF generator.

30. The apparatus of claim 27, wherein the output of the LFF generator includes a DC component; and said adjusting at least one control parameter value is accomplished by adjusting the value of said DC component.

31. The method of claim 27 wherein:

the output of the LFF generator includes a resetting ramp component; and said adjusting at least one control parameter value is accomplished by performing at least one of the steps of (a) adjusting the value of the slope of said ramp component, and (b) resetting said ramp component.

32. The apparatus of claim 22, and further comprising:

means, responsive to deviations of said difference signal from said permissible range, arising from the presence of fluctuations in the SOI fraction of the input signal, for determining whether to adjust said control parameter set.

33. The apparatus of claim 32, wherein said means for determining comprises:

means for multiplying the sign of said deviation by a weighting value to produce a signed weight;

means for using said signed weight, together with similar signed weights collected from past deviations, to compute a test quantity; and means, responsive to said test quantity exceeding a predetermined value, for adjusting at least one control parameter value.

34. The apparatus of claim 33 wherein said test quantity is computed according to the formula:

$$W_i = ((N-1)/N)W_{i-1} + V_i/N$$

where $W_i$ is the value of the test quantity associated with the ith deviation, $W_{i-1}$ is the value of the test quantity associated with the (i−1)th (i.e., preceding) deviation, $V_i$ is the signed weight, and N is a constant.

35. The apparatus of claim 34 wherein N is a power of 2.

36. The apparatus of claim 22, and further comprising:

means, responsive to said set of at least one input parameter, for generating a replica of the output of the LFF generator; and means for recombining said replica with said difference signal to thereby approximately reconstruct the OAIS.

37. The apparatus of claim 22, and further comprising:

means, responsive to said control parameter set, for computing the effects, in any uses made of said difference signal by following pieces of apparatus, of the removal of the LFF generator's output from the OAIS.

38. The apparatus of claim 22 wherein the LFF generator includes a set of at least one digital-to-analog converter (DAC); and said control parameter set includes digital inputs to said set of DACs.

39. An apparatus in x-ray or gamma-ray spectroscopy for extracting photon energy information contained in an original preamplifier input signal (PAIS) that is characterized by a series of accumulating steps that is intermittently reset, the steps having step heights representative of photon energies, the PAIS thus being composed of (i) a parametrically describable (PD) fraction comprising a resetting ramp, the PD fraction having a high dynamic range, and (ii) a "signal of interest" (SOI) fraction comprising a train of pulses having pulse heights corresponding to the step heights, the SOI fraction being superimposed on the PD fraction and having a significantly smaller dynamic range, the apparatus comprising:

a signal generator which generates a resetting ramp signal that is an approximate replica of the PD fraction using a set of at least one control parameter;

a subtracting stage which generates a difference signal representative of the difference between said PAIS and said resetting ramp signal, the difference signal thus being characterized by a dynamic range significantly less than the dynamic range of the PD fraction signal; and an analog-to-digital converter (ADC) which digitizes said difference signal to obtain a digital signal that includes information on the heights of the pulses.

* * * * *